United States Patent [19]

Minagawa et al.

[11] 4,365,216
[45] Dec. 21, 1982

[54] SURFACE-ACOUSTIC-WAVE DEVICE

[75] Inventors: Shoichi Minagawa; Takeshi Okamoto; Takamasa Sakai, all of Toda, Japan

[73] Assignee: Clarion Co., Ltd., Tokyo, Japan

[21] Appl. No.: 223,059

[22] Filed: Jan. 7, 1981

[30] Foreign Application Priority Data

Jan. 16, 1980 [JP] Japan ................................ 55-2601

[51] Int. Cl.³ ...................... H03F 7/04; H03H 9/145
[52] U.S. Cl. ................................. 333/153; 307/424; 330/4.5; 330/5.5
[58] Field of Search ................. 333/150–155, 333/193–196; 331/107 A; 330/5.5, 4.5, 4.6, 4.9; 307/424; 364/821

[56] References Cited

U.S. PATENT DOCUMENTS

| | | | |
|---|---|---|---|
| 3,696,312 | 10/1972 | Kuhn et al. | 330/4.5 |
| 3,862,431 | 1/1975 | Quate et al. | 307/424 |
| 4,288,765 | 9/1981 | Mikoshiba et al. | 333/195 X |

OTHER PUBLICATIONS

Minagawa et al. – "Parametric Amplification and Generation of Surface Acoustic Waves on a Monolithic MIS Structure", Appl. Phys. Let. 33(8), Oct. 15, 1978; pp. 687–689.

*Primary Examiner*—Marvin L. Nussbaum
*Attorney, Agent, or Firm*—Flynn, Thiel, Boutell & Tanis

[57] ABSTRACT

A surface-acoustic-wave device wherein a plurality of metal strips (S) are provided on a propagation path of surface acoustic wave which is formed in a laminate comprised of a piezoelectric layer (23) and a semiconductor (1), the metal strips are extended onto the semiconductor outside the propagation path of surface acoustic wave, and depletion layer capacitance nonlinearity created on the semiconductor surface at a region where the metal strips are extended is used as a main factor of a parametric interaction.

11 Claims, 12 Drawing Figures

SURFACE-ACOUSTIC-WAVE DEVICE

BACKGROUND OF THE INVENTION

1. Field of the Invention

This invention relates to a surface-acoustic-wave device functioning as a surface-acoustic-wave amplifier.

2. Description of the Prior Art

As disclosed in U.S. Pat. No. 4,233,530, the assignee of the present invention has developed a surface-acoustic-wave device as illustrated in FIG. 1, which is operative by a continuous wave and has a desired S/N ratio.

In FIG. 1, numeral 1 designates a semiconductor substrate, and an insulator film 2 and a piezoelectric layer 3 are laminated on the semiconductor substrate 1. A square pumping electrode 4 to which a DC bias voltage and a pumping voltage are applied and input and output transducers 5 and 6 are arranged on the piezoelectric layer 3.

Numeral 7 designates a DC source for applying a DC bias voltage, 8 is an inductor for AC blocking, 9 is a high-frequency power source for applying a pumping voltage, 10 is a capacitor for DC blocking, 11 is a matching circuit, 12 and 13 are surface-acoustic-wave absorbing members for preventing undesired reflection of surface acoustic wave at the ends of the device.

The DC bias voltage is applied from the DC power source 7 to the pumping electrode 4 so as to create a suitable depletion-layer capacitance at a surface portion of the semiconductor substrate 1 under the pumping electrode 4. Further, the pumping voltage having a frequency 2fo twice that of a center frequency fo of a desired frequency band is applied from the high-frequency power source 9 to the pumping electrode 4 so that the depletion layer capacitance is caused to oscillate and modulated at the frequency 2fo.

When an electric signal is applied to the broad-band input transducer 5, the input electric signal is converted into a surface-acoustic-wave signal which is propagated on the surface of the piezoelectric layer 3 rightwardly and leftwardly as viewed in FIG. 1.

In the course that a signal component of the surface-acoustic-wave input signal 15 propagating in the rightward direction, which has a frequency around fo, passes through an operating region under the pumping electrode 4, the piezoelectric potential thereof is subjected to a parametric interaction with the pumping voltage due to the depletion layer capacitance non-linearity effect on the surface of the semiconductor substrate 1 so that the component is amplified. This amplified surface-acoustic-wave signal 16 is converted into and outputted in the form of an electric signal by the output transducer 6.

At the same time, a surface-acoustic-wave signal 17, which has a frequency fi (fi=2fo−fs, fs: a frequency of the input signal) corresponding to the amplitude of the surface-acoustic-wave input signal 15, is also produced from the pumping electrode 4 and propagated leftwardly as viewed in FIG. 1. This surface-acoustic-wave signal 17 may also be outputted as an output signal.

In the surface-acoustic-wave device having the square pumping electrode 4 as described above, a circuit electrically equivalent to the condition beneath the pumping electrode 4 is as illustrated in FIG. 2. In FIG. 2, $C_1$ is a capacitance of the piezoelectric layer 3, $C_2$ is a capacitance of the insulating layer 2 and $C_3$ is a depletion layer capacitance of a surface of the semiconductor substrate 1.

The relations between the aforesaid capacitances and the parametric interaction will now be discussed. The efficiency of the parametric interaction is enhanced as the capacitance $C_2$ of the insulating film 2 is increased and when the depletion layer capacitance $C_3$ is substantially equal to the capacitance $C_1$ of the piezoelectric layer 3. The value of the capacitance $C_1$ of the piezoelectric layer 3 per unit area is in inverse proportion to a thickness d of the piezoelectric layer 3, and the thickness d of the piezoelectric layer 3 is suitably determined in connection with a wavelength of a surface acoustic wave.

The value of the depletion layer capacitance $C_3$ per unit area is determined by resistivity of a surface portion of the semiconductor substrate 1. In practical use, the value of the resistivity is restricted.

As described above, the capacitance $C_1$ of the piezoelectric layer and the depletion layer capacitance $C_3$ are determined by different factors, respectively. This makes it very difficult to maximize the efficiency of the parametric interaction at a desired frequency. In this respect, a further improvement has been awaited for the conventional surface-acoustic-wave device although it have excellent effects as described above.

SUMMARY OF THE INVENTION

It is therefore an object of the present invention to provide a surface-acoustic-wave device which is capable of solving the technical problem involved in the conventional surface-acoustic-wave device as described above.

In accordance with the present invention, there is provided a surface-acoustic-wave device which comprises:

a laminate formed of a piezoelectric layer and a semiconductor layer;

a plurality of metal strip disposed on a propagation path of surface acoustic wave in said laminate;

a pumping electrode disposed on said piezoelectric layer and on said propagation path of surface acoustic wave; and a means for applying a pumping voltage to said pumping electrode;

each of said metal strips having a portion extending to said semiconductor layer in a region out of said propagation path of surface acoustic wave.

BRIEF DESCRIPTION OF THE DRAWINGS

FIG. 9 is a cross-sectional view showing an example wherein a metal strip is in Schottky contact with a semiconductor; FIG. 10 is a cross-sectional view showing an example wherein a metal strip is faced to a semiconductor through a p-n junction; FIG. 11 is a perspective view showing an example wherein metal strips are separately applied with a DC bias voltage; and FIG. 12 is a cross-sectional view of the device illustrated in FIG. 11.

DESCRIPTION OF THE EMBODIMENT

Figure 1:
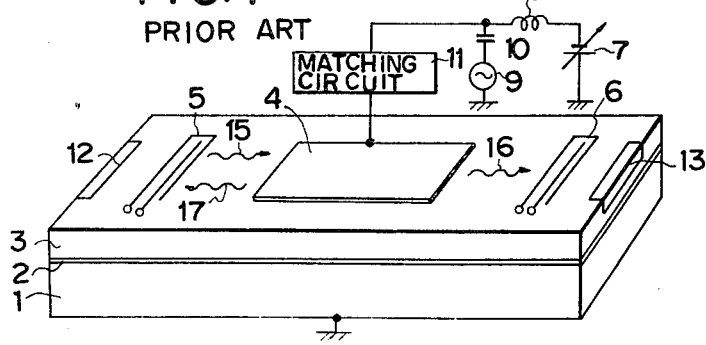
FIG. 1 is a perspective view of a conventional surface-acoustic-wave device.
Figure 2:
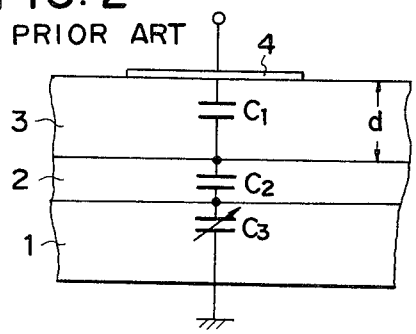
FIG. 2 is an explanatory diagram of a circuit electrically equivalent to a condition beneath a pumping electrode.

Referring now to the drawings, more particularly to FIGS. 3 to 8, there is illustrated a preferred embodiment of the present invention.

In these figures, the same or similar parts and portions as/or to those in FIG. 1 are indicated by the same or similar numerals.

Figure 3:
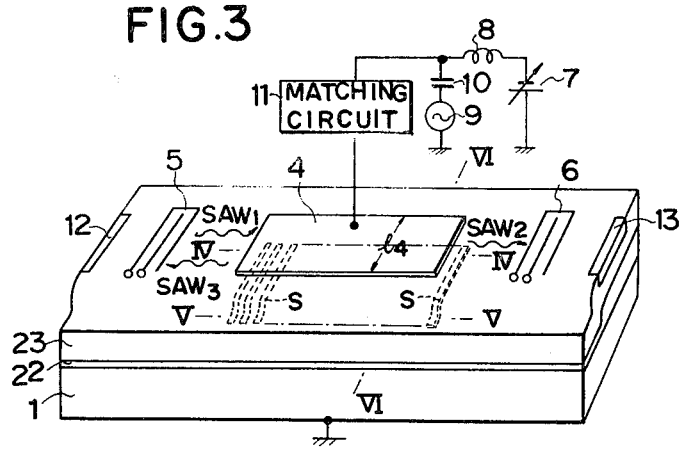
FIG. 3 is a perspective view of a surface-acoustic-wave device embodying the present invention.
Figure 4:
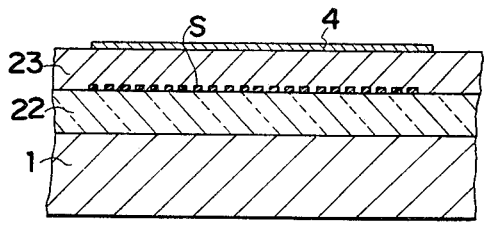
FIG. 4 is a fragmentary sectional view of the device illustrated in FIG. 3, taken along a line IV—IV.
Figure 5:
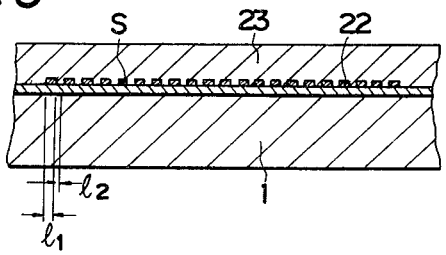
FIG. 5 is a similar fragmentary sectional view of the device illustrated in FIG. 3, taken along a line V—V.

In FIG. 3, 1 is a semiconductor substrate made, for example, of silicon (si). An insulating film 22 and a piezoelectric layer 23 are laid on the semiconductor substrate 1 in the order, to form a laminate.

The insulating film 22 is used for surface passivation of the semiconductor substrate 1 and formed, for example, of silicon dioxide ($SiO_2$).

This insulating film 22 has a portion thinner than remaining portions as described in detail later. The piezoelectric layer 23 is formed of a piezoelectric material such as zinc oxide (ZnO), aluminum nitride (AlN), etc.

An input transducer 5 and an output transducer 6 are disposed on the laminate at positions near the opposite ends of the laminate, respectively. These input and output transducers 5 and 6 are adapted so as to have a sufficiently broad band characteristic.

A propagation path of a surface acoustic wave is formed between the input transducer 5 and the output transducer 6, and a pumping electrode 4 is disposed on the propagation path on the piezoelectric layer 23. This pumping electrode 4 is formed, for example, of a single square electrode plate.

A plurality of metal strips S . . . are disposed on the propagation path beneath the pumping electrode 4. The arrangement mode of the metal strips S will be described in detail later.

Numeral 7 designates a DC power source for applying a DC bias voltage, 8 is an AC blocking inductor, 9 is a high-frequency power source for applying a pumping voltage, 10 is a DC blocking capacitor, and 11 is a matching circuit. Numerals 12 and 13 designate surface-acoustic-wave absorbing members for preventing undesired reflection at ends of the laminate.

The arrangement modes of plural metal strips will now be described in detail referring to FIGS. 4 to 8.

Figure 6:
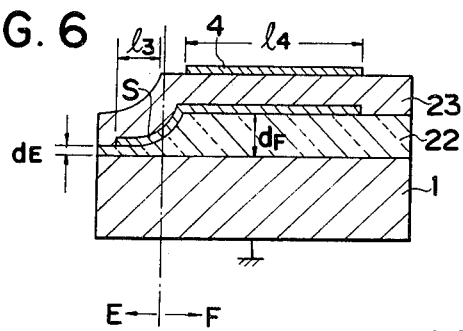
FIG. 6 is a sectional view of the device illustrated in FIG. 3, taken along a line VI—VI.
Figure 7:
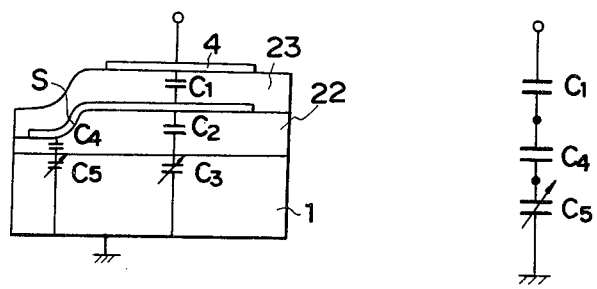
FIG. 7 is an explanatory view showing capacitances at various portions of the device illustrated in FIG. 6.

As can be seen from FIG. 6, the metal strips S are disposed interlaminer portion between the piezoelectric layer 23 and the insulating layer 22. The metal strips S are each formed in a rectangular shape and arranged in paralled with each other along the propagation path of surface acoustic wave. More specifically, the rectangular metal strips S are so arranged that the longer sides of the respective strips S are disposed in the direction perpendicular to the propagation direction of surface acoustic wave.

Each metal strip S has the same width $l_1$ and arranged at regular intervals $l_2$. The width $l_1$ and the interval $l_2$ are selected so as to be smaller than a wavelength $\lambda_0$ of signal surface acoustic wave. With this selection, influences on surface acoustic wave, such as mechanical reflection etc., which will otherwise be caused by metal strips S disposed in the propagation path of surface acoustic wave, can be reduced as low as negligible and deterioration of propagating signal can be prevented.

The so arranged metal strips S each have a portion extended into an E-region (FIG. 6) out of the propagation path, and a thickness $d_E$ of the insulating layer 22 at the E-region is made smaller than a thickness $d_F$ of the same at an F-region within the propagation path of surface acoustic wave.

The linear length of each metal strip S at the E-region is assumed to be $l_3$. If the width of the pumping electrode 4 in the direction perpendicular to the propagation direction of surface acoustic wave is assummed to be $l_4$, this width $l_4$ substantially corresponds to a propagation width (beam width) of surface acoustic wave.

In comparison between capacitances $C_4$ and $C_2$ per unit area of the insulating layer 22 at the E-region and at the F-region, respectively, there can be found a relation of $C_4 > C_2$. The capacitance $C_4$ is determined substantially by the thickness $d_E$ of the insulating layer at the E-region and the length $l_3$ of the metal strip S.

The difference between $C_4$ and $C_2$ is selected so that the impedance of the capacitance $C_4$ may be sufficiently smaller than that of the capacitance $C_2$ at a frequency of the pumping voltage.

Figure 8:
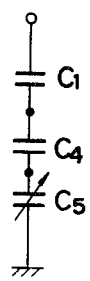
FIG. 8 is a diagram showing an electric equivalent circuit seen from a pumping electrode of the device illustrated in FIG. 7.

By this selection, most of a current at the pumping voltage applied to the metal strips S flows to ground through the E-region. This is illustrated in FIG. 8 in the form of an electric equivalent circuit seen from the pumping electrode 4. In FIG. 8, $C_5$ is a depletion layer capacitance of the semiconductor surface at the E-region. The capacitance value of the depletion layer capacitance $C_5$ is determined substantially by a surface resistivity of the semiconductor substrate 1 and the length $l_3$ of the metal strip S.

As described above, most of the current at the pumping voltage flows through the E-region of the semiconductor substrate 1 in the course of $C_1 \rightarrow C_4 \rightarrow C_5$. Therefore, depletion layer capacitance non-linearity caused at the E-region of the semiconductor surface is a main factor of a parametric interaction.

It is to be noted that the capacitance $C_1$ of the piezoelectric layer 23 in the aforesaid course may be changed by a thickness of the piezoelectric layer 23 and a width $l_4$ of the pumping electrode 4, whereas the capacitance $C_5$ of the semiconductor surface is varied depending upon the length $l_3$ of the metal strip S. Thus, the capacitances $C_1$ and $C_5$ are adjustable by different factors, independently, so that the values of the capacitances $C_1$ and $C_5$ may be set similar to each other.

One embodiment of the surface acoustic-wave device according to the present invention is constructed as described above and operates as will be described below.

A DC bias voltage of suitable value is applied to the pumping electrode 4 from the DC power source 7 to create a suitable depletion layer capacitance over the E-region and the F-region. A pumping voltage having a frequency $2f_o$ twice that of a center frequency $f_o$ of desired frequency band is also applied to the pumping electrode 4 from the high-frequency power source 9. Since, in the insulating layer 22, the impedance is set so as to be smaller at the E-region, the current at the pumping voltage flows in the course of pumping electrode 4 → piezoelectric layer 23 → metal strips S → capacitance $C_4$ at E-region of insulating layer 22 → semiconductor substrate 1. The depletion layer capacitance on the semiconductor surface is excited and modulated at the frequency 2fo of the pumping voltage.

On the other hand, an input electric signal applied to the wide-band transducer 5 is converted into surface acoustic wave and propagated rightwardly and leftwardly as viewed in FIG. 3 through the piezoelectric layer 23 form the input transducer 5.

In the course that a signal component of a surface acoustic wave input signal $SAW_1$ propagating rightwardly, which has a frequency around fo, is propagated through the metal strips S, the piezoelectric potential is introduced to the semiconductor surface in the E-region and subjected to the parametric interaction with the pumping voltage by the depletion layer capacitance non-linearity effect at the surface of the semiconductor substrate. As a result, the component is amplified so as to produce an output surface acoustic wave from the pumping electrode 4 rightwardly and leftwardly as viewed in FIG. 3.

According to the present invention, in the parametric interaction, the capacitance $C_4$ of the insulating layer 22 in the E-region may be increased and the values of the capacitance $C_1$ of the piezoelectric layer 23 and the depletion layer capacitance $C_5$ may be set as being substantially equal to each other. Therefore, the efficiency of the parametric interaction can be increased to the maximum.

Output surface acoustic wave $SAW_2$ travelling in the same direction as the input surface acoustic wave $SAW_1$ is converted into an electric signal by the output transducer 6 and outputted to the outside.

The output surface acoustic wave $SAW_3$ travelling in the direction opposite to that of the input surface acoustic wave $SAW_1$ is derived outside as an electric signal using the input transducer 5 or another suitable means, e.g., an output means having a multi-strip coupler as disclosed in Japanese Application No. 54-64923 (1979).

Figure 9:
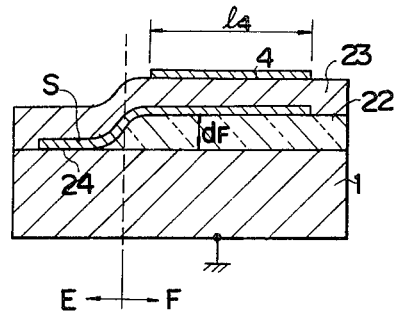
FIGS. 9 to 12 illustrate various examples of extension portion of metal strip.

Further embodiments will now be described referring to FIGS. 9 to 12. In FIG. 9, depletion layer capacitance non-linearity is created at the surface portion of the semiconductor substrate 1 in the E-region where each of the metal strips S has an extension and this depletion layer capacitance non-linearity is used as a main factor of the parametric interaction. In this case, the insulating layer at the E-region is removed until the thickness of the insulating layer becomes zero, so that each of the metal strips S is in Schottky contact 24 with the surface of the semicondutor substrate 1.

According to this example, the impedance between the metal strip S and the semiconductor substrate 1 at the E-region can further be reduced as compared with the foregoing embodiment (FIG. 6 etc.) and therefore the efficiency of the parametric interaction can further be enhanced. In addition, since there is no need to provide the insulating layer at the E-region and it suffices to provide Schottky contact between the metal strip S and the semiconductor, the fabrication of the entire device is simplified.

Figure 10:
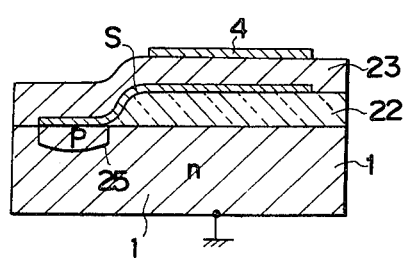

Similarly, in an example of FIG. 10, depletion layer capacitance non-linearity is caused on the semiconductor substrate 1 at the E-region and this depletion layer capacitance non-linearity is used as a main factor of the parametric interaction. In this case, however, p-n junction 25 is formed on the semiconductor surface in the E-region at a portion thereof corresponding to each of the metal strips S. Each metal strip S at the E-region is faced to the semiconductor substrate 1 through the p-n junction.

In this example, since the thickness of the insulating layer at the E-region is zero and the impedance between the metal strip S and the semiconductor substrate 1 is reduced, the efficiency of the parametric interaction can be enhanced very much as in the example of FIG. 9.

Figure 11:
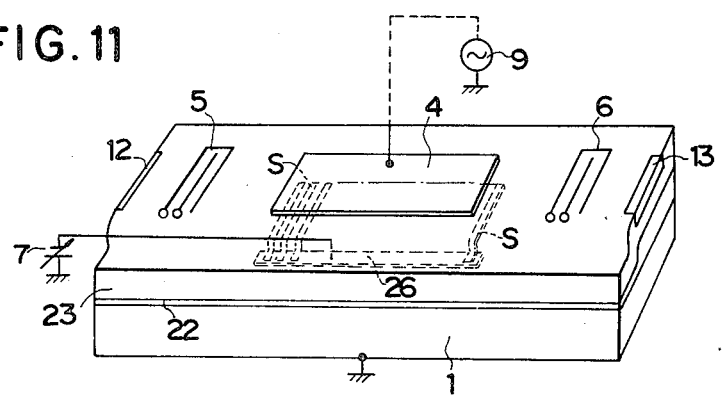
Figure 12:
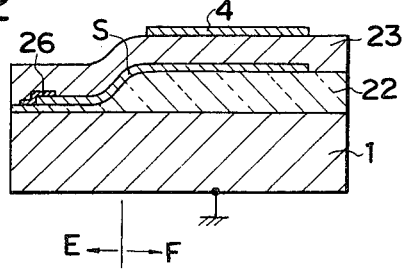

FIGS. 11 and 12 illustrate modification in the voltage application mode for creating depletion layer capacitance non-linearity. In this example, the pumping electrode 4 is applied only with a pumping voltage and the metal strips S is separately applied with a DC bias voltage.

In order to apply the DC bias voltage to the respective metal strip S, a single DC power source 7 is used and the metal strips S are connected by a common thin-film resistor 26 formed, for example, by evaporation. The DC power source 7 is coupled to the thin-film resistor 26.

The metal strips S are commonly connected by the resistor because it is desirable that the metal strips S be insulated from each other with respect to a high-frequency signal. Alternatively, the metal strips S may be commonly connected by an inductor.

Since a direct current does not flow at the DC bias voltage applied to the respective metal strips S, there is caused no problem in application of the DC bias voltage by connecting the metal strips through the high resistance element as described above.

As can be understood from the foregoing description, according to the present invention, a plurality of metal strips are disposed on the propagation path of the surface acoustic wave and have respective extensions extending into a region out of the propagation path and depletion layer capacitance non-linearity created on the semiconductor surface at the region is used as a main factor of the parametric interaction. Therefore, the value of the depletion layer capacitance in the parametric interaction region can be varied by adjusting the length of the extended portion of the metal strip, and the relation between the capacitance value of the piezoelectric layer within the propagation path of surface acoustic wave and the capacitance value of the aforesaid depletion layer capacitance can be set so as to maximize the efficiency of the parametric interaction.

When the insulating layer for surface passivation of the semiconductor substrate is interposed between the piezoelectric layer and the semiconductor substrate, the efficiency of the parametric interaction is not lowered by the increased thickness of the insulating layer at a portion of the propagation path of surface acoustic wave. Therefore, by increasing the thickness of the insulating layer at the portion, the surface acoustic wave can effectively be converged, thereby to prevent diffusion of the surface acoustic wave during propagation thereof and minimize a loss due to the diffusion.

We claim:
1. A surface-acoustic-wave device which comprises:
a laminate formed of a piezoelectric layer and a semiconductor layer;
a plurality of metal strips disposed on a propagation path of surface acoustic wave in said laminate;
a pumping electrode disposed on said piezoelectric layer and on said propagation path of surface acoustic wave; and
a means for applying a pumping voltage to said pumping electrode;

each of said metal strips having a portion extending to said semiconductor layer in a region out of said propagation path of surface acoustic wave.

2. A surface-acoustic-wave device according to claim 1, wherein each of said metal strips is formed in a rectangular shape and arranged so that the longer sides thereof may be disposed in the direction perpendicular to the propagation direction of surface acoustic wave.

3. A surface-acoustic-wave device according to claim 1 or 2, which further comprises an insulating layer interposed between said piezoelectric layer and said semiconductor layer, said metal strips being provided at an interlaminar portion between said insulating layer and said piezoelectric layer.

4. A surface-acoustic-wave device according to claim 3, wherein the thickness of said insulating layer is reduced at said region into which said metal strips extend, than at the propagation path of surface acoustic wave.

5. A surface-acoustic-wave device according to claim 1, wherein the extended portions of the respective metal strips are in Schottky contact with said semiconductor layer.

6. A surface-acoustic-wave device according to claim 1, which further comprises p-n junctions provided on said semiconductor layer at portions corresponding to the extended portions of the metal strips, respectively, said extended portions being combined with said semiconductor layer through the respective p-n junctions.

7. A surface-acoustic-wave device according to claim 1, which further comprises a means for applying a DC bias voltage to said pumping electrode.

8. A surface-acoustic-wave device according to claim 1, which further comprises a means for applying a DC bias voltage to said metal strips.

9. A surface-acoustic-wave device according to claim 1, wherein the capacitance of said piezoelectric layer and the capacitance of said semiconductor layer are substantially equal to each other.

10. A surface-acoustic-wave device according to claim 1, which further comprises an input and an output transducer provided on said laminate on opposite sides of said pumping electrode.

11. A surface-acoustic-wave device according to claim 1, which further comprises a thin-film resistor for commonly connecting said metal strips and a means for applying a DC voltage to said resistor.

* * * * *